(12) United States Patent
Liu et al.

(10) Patent No.: US 7,215,577 B2
(45) Date of Patent: May 8, 2007

(54) FLASH MEMORY CELL AND METHODS FOR PROGRAMMING AND ERASING

(75) Inventors: Zhizheng Liu, Sunnyvale, CA (US); Zengtao Liu, Sunnyvale, CA (US); Yi He, Fremont, CA (US); Mark Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/511,763

(22) Filed: Aug. 29, 2006

(65) Prior Publication Data
US 2006/0291282 A1    Dec. 28, 2006

Related U.S. Application Data

(62) Division of application No. 10/841,850, filed on May 7, 2004, now Pat. No. 7,120,063.

(51) Int. Cl.
  *G11C 11/34* (2006.01)
  *G11C 16/04* (2006.01)
  *H01L 29/78* (2006.01)

(52) U.S. Cl. .............. 365/185.24; 257/288; 257/314; 365/185.16; 365/185.17

(58) Field of Classification Search ............ 365/185
See application file for complete search history.

(56) References Cited

U.S. PATENT DOCUMENTS

| 3,881,180 A | 4/1975 | Gosney, Jr. |
| 5,111,430 A | 5/1992 | Morie |
| 5,202,850 A | 4/1993 | Jenq |
| 6,862,221 B1 | 3/2005 | Melik-Martirosian et al. |
| 6,865,145 B2 | 11/2005 | Choi |
| 2004/0027877 A1 | 2/2004 | Kotz et al. |
| 2005/0237813 A1 | 10/2005 | Zous et al. |

OTHER PUBLICATIONS

*Nonvolatile Semiconducor Memory Technology,* "Floating Gat Flash Memories", Manzur Gill and Stefan Lai, 1998 IEEE Press, 5 pgs.

*Primary Examiner*—Amir Zarabian
*Assistant Examiner*—Michael Weinberg
(74) *Attorney, Agent, or Firm*—Eschweiler & Associates, LLC

(57) ABSTRACT

Flash memory cells are presented which comprise a dielectric material formed above a substrate channel region, a charge trapping material formed over the dielectric material, and a control gate formed over the charge trapping material. The cell may be programmed by directing electrons from the control gate into the charge trapping material to raise the cell threshold voltage. The electrons may be directed from the control gate to the charge trapping material by coupling a substrate to a substrate voltage potential, and coupling the control gate to a gate voltage potential, where the gate voltage potential is lower than the substrate voltage potential. The cell may be erased by directing electrons from the charge trapping material into the control gate to lower a threshold voltage of the flash memory cell, such as by coupling the substrate to a substrate voltage potential, and coupling the control gate to a gate voltage potential, where the gate voltage potential is higher than the substrate voltage potential.

16 Claims, 6 Drawing Sheets

FLASH MEMORY CELL AND METHODS FOR PROGRAMMING AND ERASING

REFERENCE TO RELATED APPLICATIONS

This application is a divisional of U.S. patent application Ser. No. 10/841,850 filed May 7, 2004, now U.S. Pat. No. 7,120,063.

This application is related to U.S. patent application Ser. No. 10/841,788, filed on May 7, 2004, entitled FLASH MEMORY CELL WITH THIN UPPER DIELECTRIC, the entirety of which is hereby incorporated by reference as if fully set forth herein.

FIELD OF INVENTION

The invention is generally related to the field of memory devices and more particularly to flash memory cells and methods for programming and erasing the same.

BACKGROUND OF THE INVENTION

Flash memory is a non-volatile type of memory which can be rewritten and retain its data content without power. Flash and other types of electronic memory devices are constructed of memory cells that individually store and provide access to data. A typical memory cell stores a single binary piece of information referred to as a bit, which has one of two possible states. The cells are commonly organized into multiple cell units such as bytes having eight cells and words having sixteen or more such cells, usually configured in multiples of eight. Storage of data in such memory device architectures is performed by writing to a particular set of memory cells, sometimes referred to as programming the cells, where the data can then be retrieved in a read operation. In addition to programming and read operations, groups of cells in a memory device may be erased, wherein each cell in the group is set to a known state. In typical single-bit flash devices, each cell has one of two possible data states, either a programmed state or an erased state, where the data states correspond to the two possible binary states of the corresponding bit (e.g., programmed state represents binary "0" and erased state represents binary "1"). More recently, cells structures have been developed that are capable of storing two physically separated bits, and other multi-bit structures have been proposed, in which different multi-bit data combinations are represented as electrically distinguishable programming levels in a given cell.

Conventional flash memory cells include a metal oxide semiconductor (MOS) device with a gate structure in which data may be retained in the form of trapped electrical charge. The erase, program, and read operations are commonly performed by application of appropriate voltages to certain terminals of the cell MOS device. In a program or erase operation, the voltages are applied so as to cause a charge to be stored in the memory cell or removed from the cell, thereby changing or setting a threshold voltage of the cell. In a read operation, appropriate voltages are applied to cause a cell current to flow, wherein the amount of such current is related to the threshold voltage state of the cell and is thus indicative of the value of the data stored in the cell.

Conventional single-bit flash memory cells are often formed as a "stacked gate" or "SONOS" cell types. Stacked gate cells include a transistor structure having a source, a drain, and a channel in a substrate or p-well thereof, as well as a stacked gate structure overlying the channel that includes a gate dielectric layer (sometimes referred to as a tunnel oxide) formed on the surface of the P-well. The stacked gate also includes a polysilicon floating gate overlying the tunnel oxide and an interpoly dielectric layer overlying the floating gate. A doped polysilicon control gate overlies the interpoly dielectric layer to complete the stacked gate structure. The interpoly dielectric layer is often a multilayer insulator such as an oxide-nitride-oxide (ONO) layer having two oxide layers sandwiching a nitride layer.

Stacked gate cells can be programmed in a variety of ways. One common approach involves applying a relatively high positive voltage to the control gate while the source is grounded and the drain is connected to a predetermined positive potential above ground. This creates vertical and lateral electric fields along the length of the channel from the source to the drain, causing electrons to flow from the source and to begin accelerating toward the drain. As electrons move along the length of the channel, they gain energy to the point where some electrons are able to jump over the potential barrier of the tunnel oxide into the floating gate and become trapped in the floating gate (e.g., sometimes referred to as channel hot electron (CHE) injection). As a result of the trapped charge in the gate structure, the threshold voltage of the cell increases, for example, by about 2 to 5 volts. This change in the threshold voltage (and thereby the channel conductance) of the cell created by the trapped electrons is what causes the cell to be programmed (e.g., data "0"). Stacked gate cells may alternatively be programmed through Fowler-Nordheim tunneling of electrons from the substrate through the tunnel oxide by applying a positive control gate voltage while the substrate or body is held at ground or at a negative voltage, wherein electrons tunnel from the channel through the tunnel oxide and into the floating gate.

A stacked gate flash memory cell can be erased in a number of ways. In one arrangement, a relatively high positive voltage is applied to the source and the control gate is grounded while the drain is allowed to float. A strong electric field is developed across the tunnel oxide between the floating gate and the source, causing electrons that were trapped in the floating gate to undergo Fowler-Nordheim tunneling through the tunnel oxide into the source. In another arrangement, a negative voltage is applied to the control gate, and a positive voltage is applied to the source while the drain is allowed to float. Alternatively, a positive voltage is applied to the substrate and a negative voltage is applied to the control gate while the source and drain are floated to erase the cell through Fowler-Nordheim tunneling of electrons from the floating gate into the substrate.

Conventional SONOS type cells (e.g., silicon-oxide-nitride-oxide-silicon) also include an ONO structure formed over the substrate channel, with a control gate formed over the ONO structure, but without a floating gate. To program the SONOS cell, electrons are transferred from the substrate to the nitride layer in the ONO structure by applying appropriate voltage potentials to the cell terminals. Because the nitride is generally non-conductive, the trapped electrons tend to remain localized, whereby two spatially separate bits may be stored in a single cell, for example, by applying positive gate and drain voltages while the substrate is grounded, thereby creating vertical and lateral channel fields. This causes electrons to be trapped in the ONO structure near the drain end of the cell. Reversing the source and drain voltages can cause charge trapping (e.g., programming) to occur near the source end. Alternatively, SONOS cells can be programmed by Fowler-Nordheim tunneling of electrons from the substrate into the ONO structure by applying a positive gate voltage and grounding the substrate.

As with stacked gate cells, SONOS type flash cells are erased by causing the trapped electrons to migrate from the ONO structure back into the substrate through application of suitable voltages to the substrate, gate, source, and/or drain. For example, SONOS cells may be erased by grounding the substrate, source, and drain, and applying a negative gate voltage, causing Fowler-Nordheim tunneling of electrons from the ONO structure into the substrate.

A continuing trend in flash and other types of memory device designs is the reduction of device dimensions, referred to as scaling. As a result, it is desirable to reduce the size of various structures that make up flash memory cells. Another design goal is to reduce the power consumption and operating voltages in flash memories. In addition, it is desirable to increase the number of program/erase operations of flash memory devices and to shorten the time required to perform read, program, and erase operations. Furthermore, it is desirable to construct flash memory cells with improved data retention capabilities. Accordingly, there remains a need for improved flash memory devices as well as fabrication and operational methods by which these design goals can be facilitated.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later. The present invention relates to flash memory devices and fabrication methods therefor, as well as to methods for programming and erasing flash memory cells.

In accordance with an aspect of the invention, flash memory cells and gate structures therefor are provided, in which the cell gate structure comprises a dielectric material formed above a channel region of a substrate, a charge trapping material formed over the dielectric, and a control gate formed over the charge trapping material. Thus, unlike conventional SONOS type flash cells, the cells of the present invention have no upper oxide between the charge trapping material and the control gate, by which the gate structure can be made thinner to facilitate device scaling efforts. The cell may be programmed and erased by migration of charge between the control gate and the charge trapping material, such as through tunneling, unlike conventional devices in which programming and erasing charge was transferred through the substrate/dielectric interface. Consequently, the invention mitigates or avoids interface damage associated with conventional SONOS and other type flash memory cells, by which device endurance may be enhanced.

Another aspect of the invention provides a method for setting a flash memory cell to one of a plurality of data states, comprising transferring charge between a control gate and a charge trapping material of a flash memory cell to set a threshold voltage of the cell to one of a plurality of value ranges. The transfer of charge between the control gate and the charge trapping material may comprise directing electrons from the control gate into the charge trapping material, such as for programming a single-bit cell. The charge transfer may comprise directing electrons from the charge trapping material into the control gate, for example, to erase a single-bit cell.

Yet another aspect of the invention provides methods for programming a flash memory cell, which comprise directing electrons from the control gate into the charge trapping material to raise the cell threshold voltage. The electrons may be so directed by coupling a substrate to a substrate voltage potential, and coupling the control gate to a gate voltage potential, where the gate voltage potential is lower than the substrate voltage potential. This technique can be employed with the flash memory cells of the invention or with other cells, for example, to avoid or reduce cell interface damage, and thus to increase the number of program cycles the device can reliably undergo.

In still another aspect of the invention, methods are provided for erasing flash memory cells, which comprise directing electrons from the charge trapping material into the control gate. Unlike conventional erase methodologies, this aspect of the invention avoids charge transfer through the substrate/dielectric interface. As a result, the cell threshold voltage can be lowered without the interface damage potential of prior flash memory erase techniques. In one implementation, directing electrons from the charge trapping material into the control gate may comprise coupling the substrate to a substrate voltage potential, and coupling the control gate to a gate voltage potential, where the gate voltage potential is higher than the substrate voltage potential.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
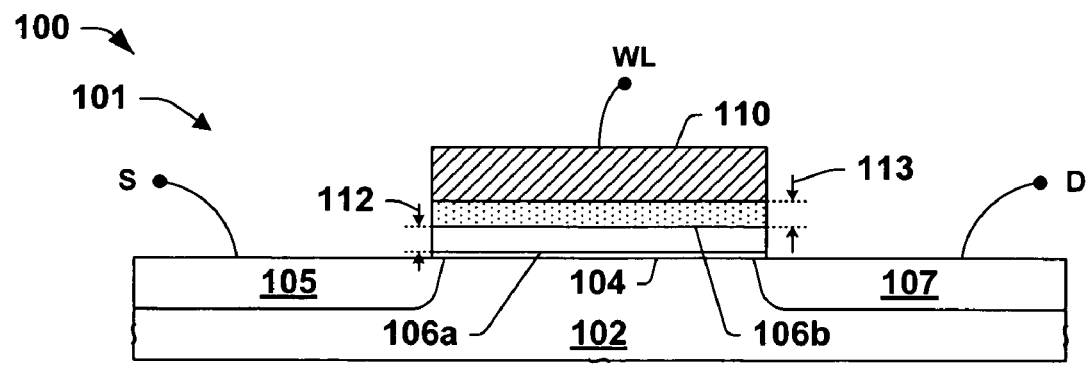
FIG. 1A is a partial side elevation view in section illustrating an exemplary flash memory cell with a control gate formed over a charge trapping material layer in accordance with one or more aspects of the present invention.

One or more implementations of the present invention will now be described with reference to the drawings, wherein like reference numerals are used to refer to like elements throughout.

The invention provides flash memory cells comprising a dielectric material formed above a substrate channel region, a charge trapping material formed over the dielectric material, and a control gate formed over the charge trapping material. As used herein, a structure that is formed over another structure is in contact therewith, whereas a structure formed above another structure may, but need not, be in contact therewith. The cells may be programmed by directing electrons from the control gate into the charge trapping material to raise the cell threshold voltage and may be erased by directing electrons from the charge trapping material into the control gate to lower the threshold voltage. The invention may be employed to facilitate scaling efforts, as well as to enhance device endurance and data retention by electron flow between a charge trapping layer and the control gate, rather than between the gate and the underlying substrate as was common in conventional devices. This capability, in turn, allows mitigation or avoidance of damage to the interface between the cell dielectric and the substrate (e.g., interface defects), thereby improving flash device endurance.

The various aspects of the invention are hereinafter illustrated and described in the context of an exemplary flash memory device in which single-bit flash cells are provided, although multi-bit cells may alternatively be created within the scope of the invention, where the structures illustrated herein are not necessarily drawn to scale. Moreover, the flash memory cells, gate structures, and the various methods of the present invention may be employed in memory arrays of any architecture, including but not limited to NOR arrays, virtual ground arrays, NAND arrays, etc., wherein all such alternative implementations are contemplated as falling within the scope of the present invention and the appended claims.

Figure 1B:
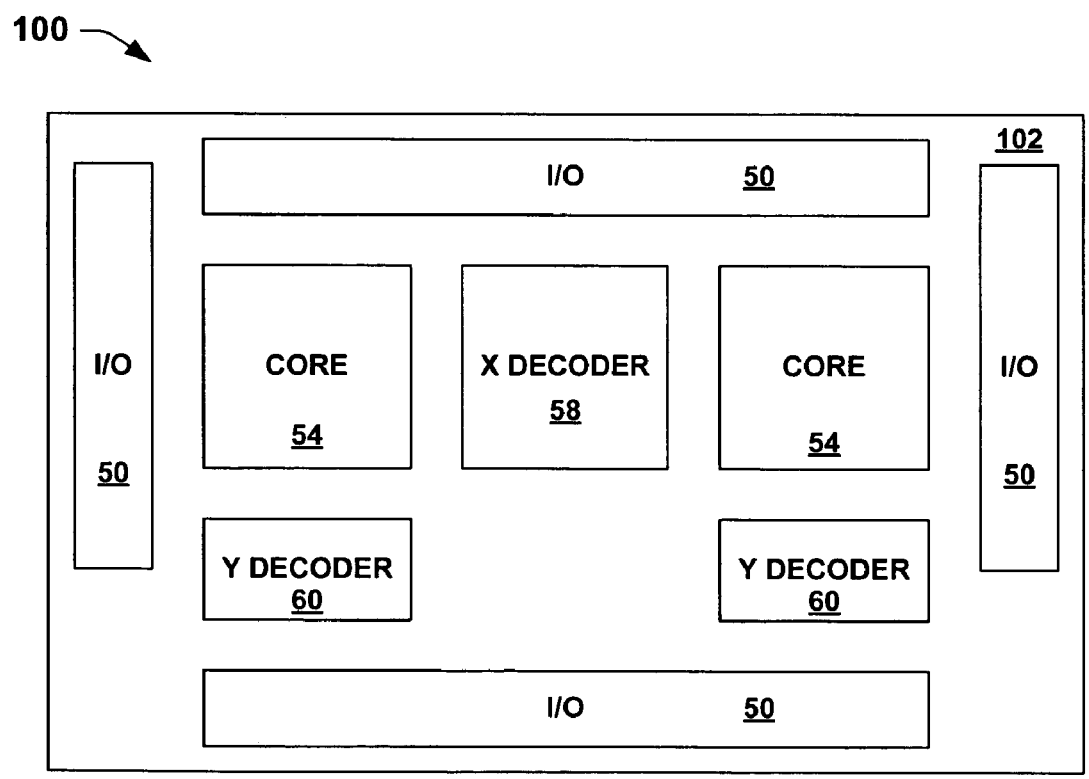
FIG. 1B is a simplified top plan view of the flash memory device of FIG. 1A in which one or more aspects of the invention may be carried out.
Figure 1C:
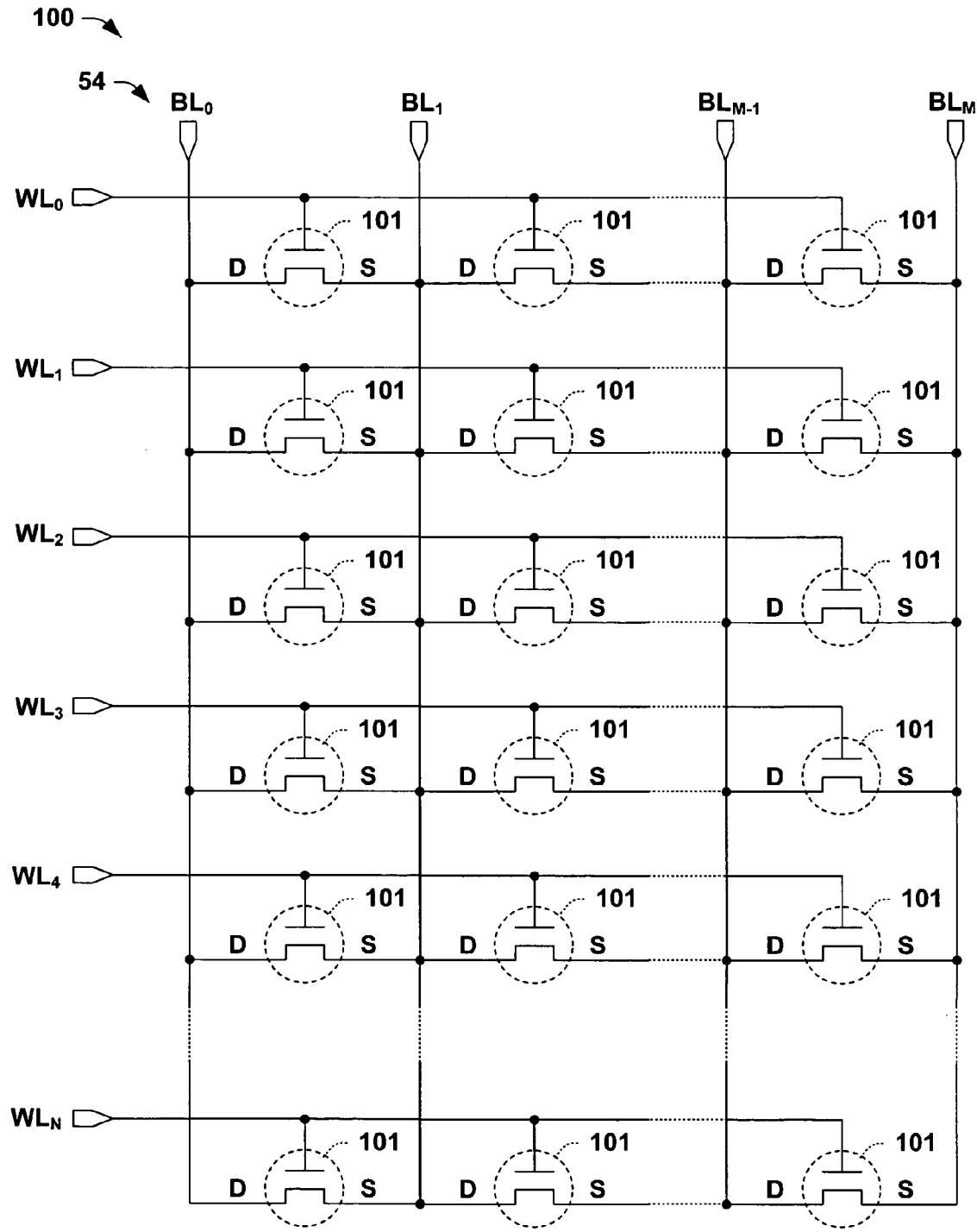
FIG. 1C is a schematic diagram illustrating a portion of a flash memory array in the device of FIGS. 1A and 1B, organized in a virtual ground configuration.
Figure 2:
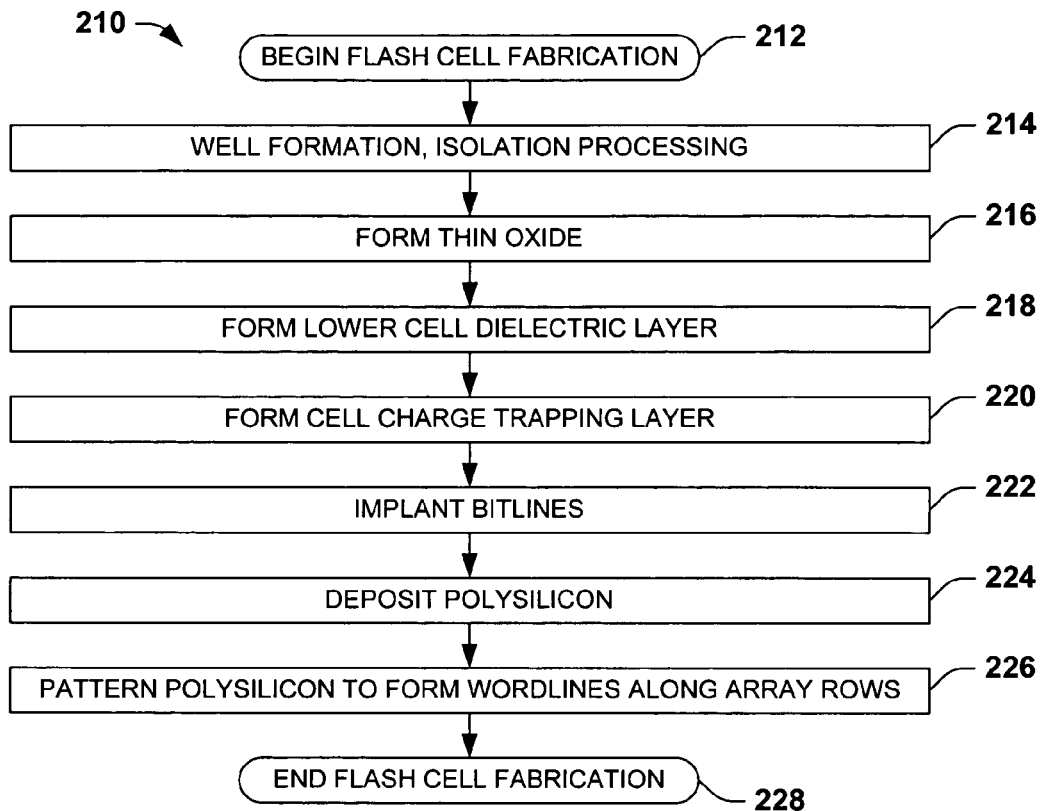
FIG. 2 is a flow diagram illustrating an exemplary method of fabricating a flash memory cell and a gate structure thereof in accordance with further aspects of the invention.
Figure 6:
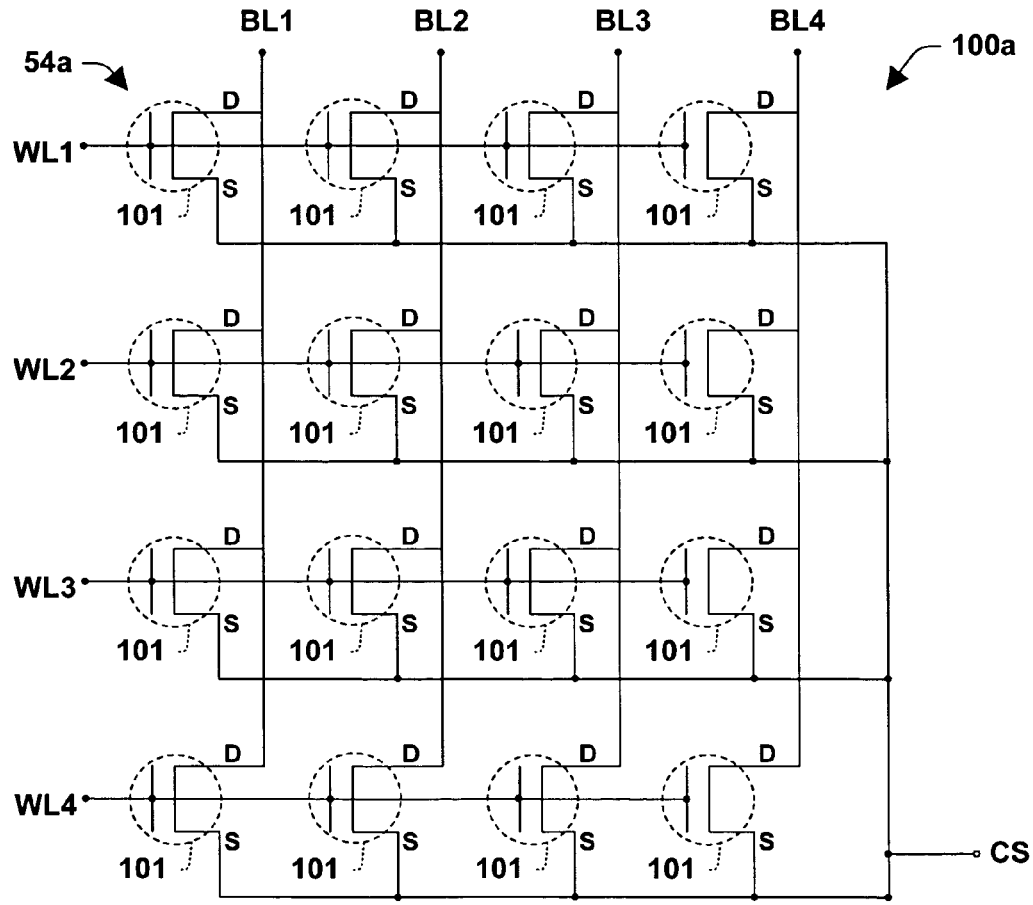
FIG. 6 a schematic diagram illustrating an alternative array for the device of FIGS. 1A–1C, organized in a NOR configuration.
Figure 7:
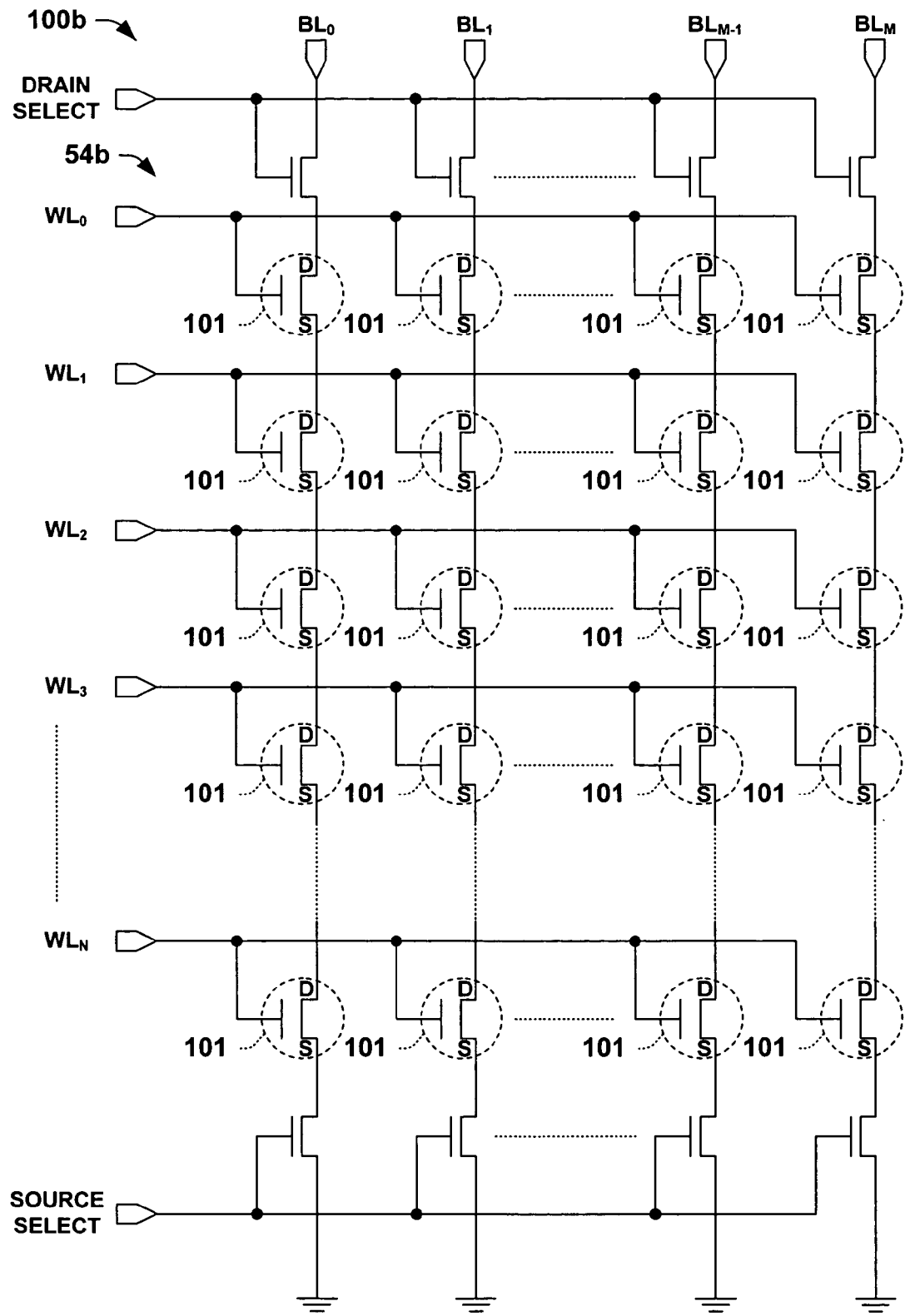
FIG. 7 a schematic diagram illustrating another alternative array for the device of FIGS. 1A–1C, organized in a NAND configuration.

FIGS. 1A–1C illustrate a flash memory device 100 in which an exemplary flash memory cell 101 is depicted in FIG. 1A in accordance with one or more aspects of the invention. FIG. 1B provides a simplified illustration of certain major components of the device 100, and FIG. 1C schematically depicts a portion of an exemplary virtual ground flash memory cell array 54 in the device 100. FIGS. 6 and 7 illustrate exemplary NOR and NAND array architectures as two possible alternative implementations of the device 100, which are described further below. The device 100 can implemented as a dedicated memory device, or other type of semiconductor device (e.g., microprocessor, logic device, etc.) in which a flash memory array 54 is included.

FIG. 1A illustrates an exemplary single-bit flash memory cell 101 of the device 100, constructed on or in a semiconductor body 102. The flash memory cells and gate structures of the invention may be implemented in association with any type of semiconductor body, including but not limited to a p-doped silicon wafer, an SOI wafer, epitaxial layer, etc. The cell 101 comprises a source 105 and a drain 107 formed on either lateral side of a channel region in the semiconductor body 102, as well as a gate structure formed above the channel region that comprises a dielectric 106a, a charge trapping material 106b, and a control gate 110.

The dielectric material 106a of the gate structure is formed to a thickness 112 of about 70 Å above the substrate 102, such as directly over the substrate or over one or more optional intervening layers, such as an optional thin oxide 104. In the illustrated device 100, the oxide 104 may be formed over the substrate 102 to operate as a gate dielectric for logic or other transistors formed outside the core array regions 54, although this oxide 104 may be omitted from the regions 54 and the cells 101 thereof within the scope of the invention. The dielectric 106a may be made of any type of dielectric material within the scope of the invention, such as silicon dioxide (e.g., $SiO_2$) in the illustrated example, and may be thicker or thinner than the illustrated example. The inventors have appreciated that while making the dielectric 106a thinner aids in device scaling, making the material 106a relatively thick may improve device data retention by mitigating undesired migration of trapped charge from the gate structure into the underlying substrate 102.

The gate structure further comprises a charge trapping material 106b formed to a thickness 113 of about 100 Å over the dielectric 106a. The exemplary charge trapping material 106b is silicon nitride (e.g., $Si_3N_4$) in the illustrated implementation, although the layer 106b may be any suitable material and thickness for trapping charge to set or establish a threshold voltage and hence a data state of the flash memory cell 101, including single-bit and multi-bit applications, within the scope of the invention. In this regard, due to the spatially localized charge trapping nature of nitride materials, nitrides may advantageously facilitate construction of multi-bit cells in accordance with the invention.

Unlike conventional SONOS and other prior cell designs, no upper oxide is formed over the charge trapping nitride 106b in the cell 101. Rather, the gate structure of the exemplary cell 101 comprises a doped polysilicon control gate 110 overlying (e.g., directly on) the charge trapping material 106b. The inventors have appreciated that eliminating the upper oxide facilitates device scaling efforts by reducing the overall gate structure thickness. The gate structure of the cell 101 also facilitates programming and erasing the cell 101 by charge exchange between the control gate 110 and the charge trapping material 106b (e.g., via electron/hole tunneling, direct or otherwise). This advantageously avoids transfer of trapped charge through the substrate interface and the associated interface defect creation during erase and program operations that has previously limited the device endurance in conventional SONOS and floating gate cell designs. The decoder circuitry 58, 60 (FIG. 1B) provides or couples wordline (WL) or other appropriate control signal voltage potentials to the control gate 110 to operate the cell 101 during program, read, and erase operations.

The exemplary control gate 110 is a doped polysilicon control gate 110 that extends along an array row to other cells (not shown) to form a conductive wordline, although other suitable control gate materials may be employed by which voltage signals may be applied to a flash cell within the scope of the invention. The exemplary polysilicon control gate 110 is doped with one or more n-type impurities (e.g., phosphorus, arsenic, antimony, etc.) thereby rendering the wordline/control gate 110 conductive. The source 105 and drain 107 are formed by implantation, diffusion, etc. of n-type impurities to create the n+ source 105 and n+ drain 107 regions in the p-type semiconductor body 102, where the source 105 and drain 107 operate as bitlines in the exemplary virtual ground array 54 configuration (FIG. 1C).

FIG. 1B illustrates a schematic top plan view of an exemplary dedicated memory device 100, comprising a semiconductor substrate 102 in which one or more high-density core regions and one or more low-density peripheral portions are formed. The core regions comprise one or more M×N array cores 54 of individually addressable, substantially identical flash memory cells 101, as the cell 101 of FIG. 1A. The peripheral portions comprise I/O circuitry 50 and programming or decoder circuitry 58 and 60 for selectively addressing the individual memory cells 101 or groups (e.g., words) thereof. The programming circuitry comprises one or more x-direction (e.g., column) decoders 58 and y-direction (e.g., row) decoders 60, which, together with the I/O circuitry 50, operate to couple the body (e.g., substrate), source, gate, and drain (e.g., wordlines and bitlines) of selected addressed memory cells 101 with predetermined voltages or impedances during program, erase, and read operations. In this regard, the decoder and I/O circuitry provide the necessary wordline and bitline control signals during memory access operations, and buffer the incoming and outgoing data associated therewith, wherein the circuits 50, 58, and 60 may be fashioned from any suitable analog and/or logic circuits and devices within the scope of the invention.

FIG. 1C illustrates a portion of one of the core arrays 54 of the device 100, wherein portions of several rows and columns of flash cells 101 are illustrated along wordlines $WL_0$ through $WL_N$ and bitlines $BL_0$ through $BL_M$, respectively, where the array 54 is illustrated in a virtual ground configuration in this example. Alternatively, flash cells of the invention may be configured or arranged in other array architectures, including but not limited to NOR, NAND, or others, such as those exemplified in FIGS. 6 and 7 below. As shown in FIG. 1C, the exemplary virtual ground array 54 comprises rows of flash cells 101 with control gate terminals coupled to a corresponding wordline WL, as well as columns of cells 101 having a drain of one cell 101 coupled to with corresponding bitline BL and the source of an adjacent cell 101. In this configuration, the drain terminals of the cells 101 within a given column are connected to the same bitline BL.

Individual flash cells 101 may be selected via a corresponding wordline WL and a pair of bitlines BL bounding the target cell 101, wherein the bitline and wordline signals are generated by the decoder circuitry 58, 60 (FIG. 1B). Thus, when a positive voltage is applied to the bitline BL coupled to the drain of a selected cell 101, a conductive path is established between the drain and the source thereof, which is coupled to ground by provision of the appropriate bitline signals from the decoders 58, 60. In this manner, a virtual ground is formed by selectively connecting a ground to the bit line associated with the source terminal of only those flash cells selected to be accessed. In the array 54, conductive n-doped polysilicon wordlines (e.g., control gates 110) are formed over the charge trapping layers 106b to create flash memory cells 101 in combination with n-doped bitline portions (e.g., sources 105 and drains 107) in the underlying p-type silicon substrate 102, with the cells 101 organized along rows (e.g., wordlines) and columns (e.g., bitlines) in the virtual ground array 54.

As illustrated in FIG. 1A, the exemplary memory cell 101 is capable of storing a single binary data bit having two electrically distinguishable data states, wherein the threshold voltage of the cell 101 is higher for a programmed cell than for an erased cell. This correlates to trapping or accumulation of more charge (e.g., electrons) within the charge trapping material 106b in the programmed state than in the erased state. Thus, depending upon the program and erase voltages employed and the dimensions of the structures of a given implementation of the cell 101, a range of cell threshold voltages will characterize an erased cell and another (e.g., non-overlapping) range of threshold voltages will characterize a programmed cell. During a read operation, a read gate voltage is applied to the control gate (WL) 110 and the source 105 and drain 107 are appropriately biased so as to conduct at least a certain minimum amount of current (e.g., cell current) if the cell is erased and to conduct less than this amount if the cell is programmed, where the read gate voltage is set between the ranges of erased and programmed threshold voltages for a given design. In this manner, a comparator or other type of comparison circuit can be used to compare the sensed cell current with a fixed reference value, where the comparator output will indicate the data state (e.g., programmed or erased; "0" or "1") of the cell 101.

As used herein, the threshold voltage of a programmed single-bit flash cell is deemed to be higher than that of an erased cell within the scope of the invention. In this regard, a single-bit programming operation (e.g., FIG. 4 below) is deemed to cause or ensure that sufficient charge is stored in the cell 101 (e.g., in the charge trapping material 106b) such that the threshold voltage is above an erased cell threshold voltage of the particular cell 101. Thus, when a previously erased cell is programmed, electrons are provided to the charge trapping material 106b, and when a previously programmed cell is again programmed, more electrons may be added into the material 106b, or in any event a sufficient amount of trapped electrons remain in the material 106b, such that the threshold voltage of the cell 101 is above the erased cell threshold voltage value. In other words, the cell is in the programmed state following the program operation regardless of the initial data state.

A single-bit erase operation (e.g., FIG. 5 below) is deemed to cause or ensure that a lesser amount of charge is stored in the cell 101 (e.g., in the material 106b), such that the threshold voltage is below a programmed cell threshold voltage following the erase operation. Accordingly, when a previously programmed cell is erased, electrons are removed from the charge trapping material 106b (e.g., holes are provided to the material 106b) such that the threshold voltage of the cell 101 is below the programmed cell threshold voltage value. Where a previously erased cell is again erased, more electrons may be removed from (e.g., more holes added to) the material 106b, or in any event less than a certain amount of trapped electrons remain therein, such that the threshold voltage of the cell 101 is below the programmed cell threshold voltage value, whereby the cell is in the erased data state following the erase operation regardless of the initial state.

For multi-bit applications, more than two electrically distinguishable data states may be possible for a single cell 101. Through application of appropriate terminal and substrate voltage potentials, the cell 101 and other cells of the invention may be selectively set to one of a plurality of data states by controlled transfer of charge between the control gate 110 and the charge trapping material 106b so as to set the cell threshold voltage to one of a plurality of corresponding value ranges. Thus, each of the plurality of cell data states will correspond to a unique range of cell threshold voltages, whereby read circuitry can interrogate the cell 101 with one or more gate voltages (e.g., with appropriate source and drain voltages) to detect the gate voltage at which the cell 101 starts to conduct above a threshold cell current. This determination will then indicate the threshold voltage range, and hence the corresponding data state to which the cell 101 has been set. In the flash memory cells of the invention, the transfer of charge between the control gate 110 and the charge trapping material 106b can thus be performed by application of gate and substrate voltages to selectively raise or lower the cell threshold voltage, and thus to set the cell data state (e.g., setting the cell to one of a plurality of data states).

With respect to device scaling and power consumption, the inventors have appreciated that elimination of the upper oxide of conventional SONOS designs reduces the overall thickness of the cell gate structure, thereby facilitating adequate control over the channel region of the substrate 102 while using lower gate voltage values during program, read, and/or erase operations. Regarding data retention, the dielectric 106a may be made as large as necessary to prevent or inhibit undesired loss of trapped charge from the charge trapping material 106b to the substrate 102.

Regarding device endurance, the inventors have appreciated that the transfer of charge between charge trapping structures and the underlying substrates in programming and erasing conventional floating gate and SONOS type flash cells leads to interface defects at or near the interface between the substrate channel region and the overlying dielectric. These defects are believed to cause or accelerate device degradation with respect to the total number of read/erase cycles before data storage and retrieval becomes unreliable for a given device. One or more aspects of the invention may be advantageously employed to avoid or mitigate such program/erase related interface damage by providing the cell structure exemplified in FIG. 1A, wherein the control gate 110 is formed over the charge trapping material 106b. As illustrated and described below with respect to FIGS. 4 and 5, charge transfer can be done between the gate 110 and the charge trapping material 106b via direct tunneling or other charge transfer mechanism, leaving the underlying substrate/dielectric interface largely unaffected by program and erase operations in the device 100 (e.g., or other data state setting operations in multi-level, multi-bit implementations).

Referring also to FIGS. 2 and 3A–3F, the flash memory cells 101 and gate structures thereof may be fabricated using any suitable materials and methodologies within the scope of the invention. Another aspect of the invention provides fabrication methods and techniques for fabricating flash memory gate structures, an example of which is illustrated and described hereinafter with respect to FIG. 2 (exemplary fabrication method 210) and FIGS. 3A–3F (showing the exemplary flash cell 101 of FIG. 1A at various stages of manufacturing). While the exemplary method 210 is illustrated and described below as a series of acts or events, the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the fabrication and/or processing of flash memory devices illustrated and described herein as well as in association with other structures and devices not illustrated.

Beginning at 212, wells and isolation structures (e.g., STI or field oxide) are formed at 214 and one or more threshold voltage (Vt) adjust implants may be performed. A thin oxide (e.g., $SiO_2$ or other suitable material) is optionally formed over the substrate at 216 (e.g., oxide 104 formed over substrate 102 in FIG. 3A), through deposition, thermal oxidation, or other suitable material formation techniques, having any suitable thickness, such as about half the thickness of a subsequently formed dielectric layer 106a in cells 101 of the flash memory array 54 or less. This thin oxide 104 may be concurrently formed at 216 over the substrate 102 in other active regions of the device wafer, for example, to operate as a gate oxide in logic transistors or other circuitry (not shown). Alternatively, the thin oxide 104 may be omitted in the memory array portions 54 of the device 100.

Figure 3A:
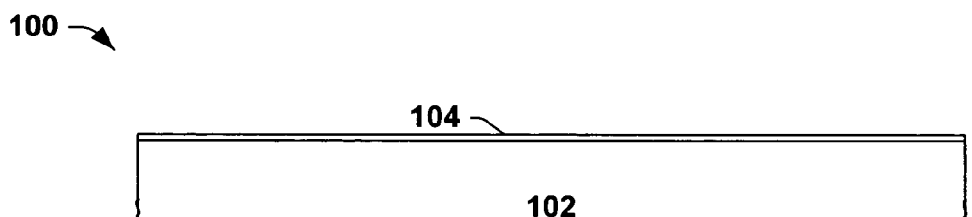
FIGS. 3A–3F are partial side elevation views in section illustrating the exemplary flash memory device of FIGS. 1A–1C undergoing fabrication processing according to the invention.
Figure 3B:
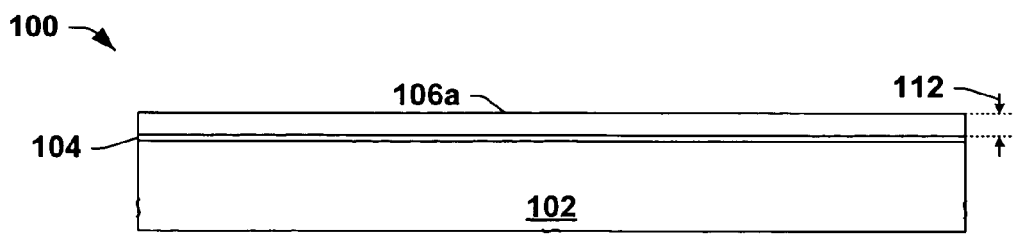
Figure 3C:
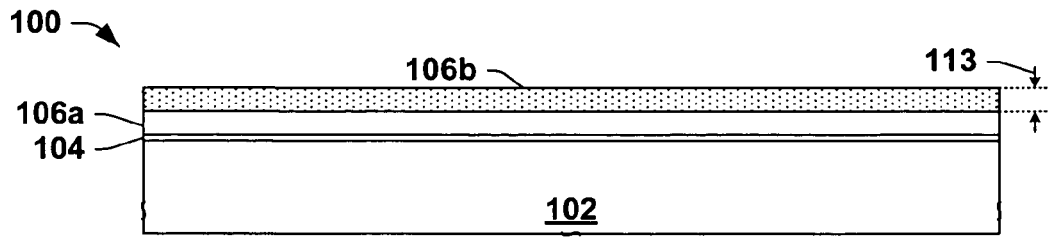

At 218, a dielectric material layer is formed above the substrate 102 at (e.g., dielectric 106a in FIG. 3B) via any suitable deposition or thermal oxidation process, for example, including but not limited to $SiO_2$ or other suitable material formed to any thickness 112, such as about 70 Å in the exemplary device 100. Where the thin oxide formation step 216 is omitted, the dielectric 106a is formed at 218 over the semiconductor body 102. Alternatively, one or more intervening material layers (e.g., such as the thin oxide 104) may be formed between the semiconductor substrate 102 and the dielectric 106a, wherein all such alternate implementations are contemplated as falling within the scope of the invention. A charge trapping material layer 106b is deposited at 220 over the dielectric 106a, for example, where the charge trapping material comprises a silicon nitride (e.g., $Si_3N_4$, etc.) deposited to any suitable thickness. In the example of FIG. 3C, a silicon nitride charge trapping layer 106b is deposited over the dielectric 106a to a thickness 113 of about 100 Å or less, such as 60 to 80 Å, although the charge trapping nitride 106b can be deposited at 220 to any thickness 113 using any suitable deposition processes within the scope of the present invention.

Figure 3D:
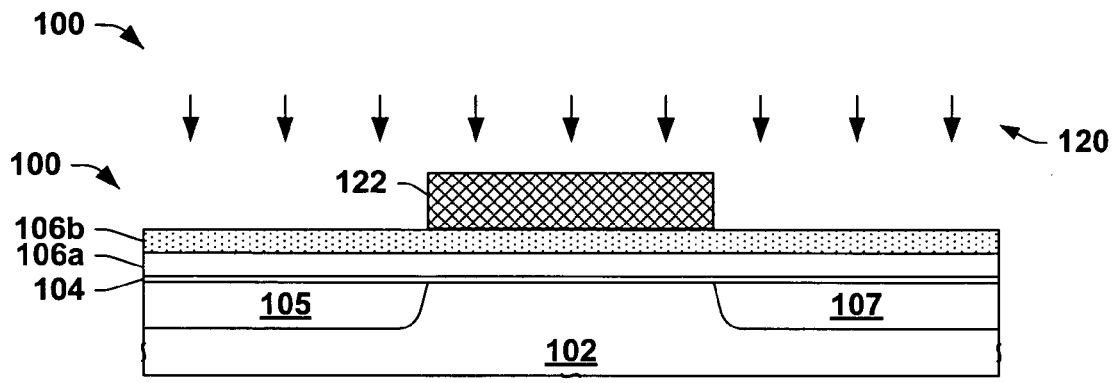
Figure 3E:
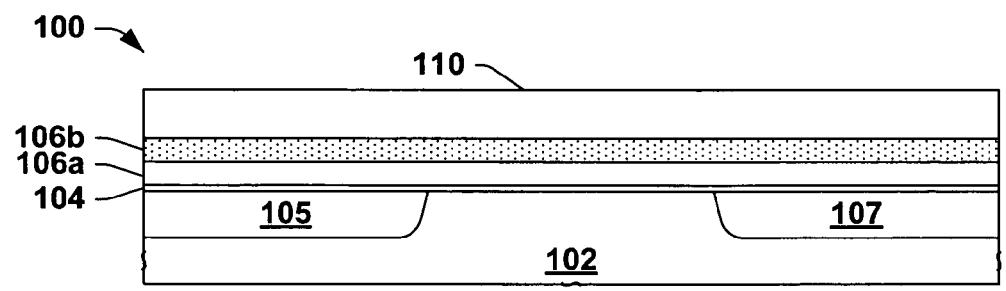
Figure 3F:
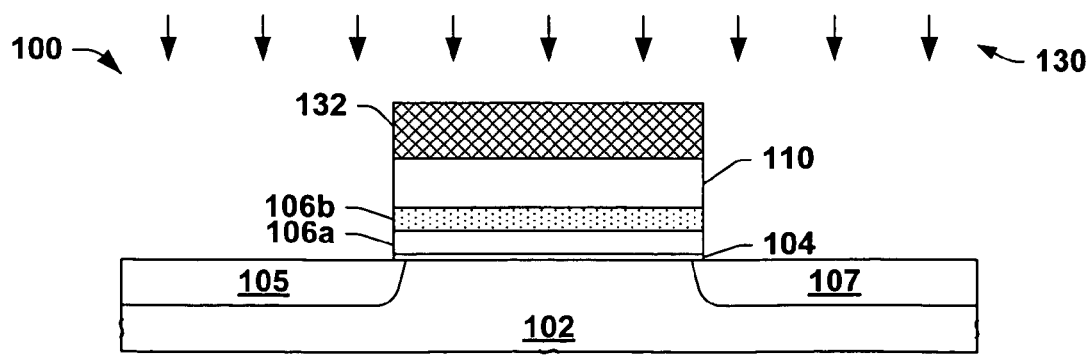

At 222, bitlines are selectively implanted along columns of the prospective memory array 54. In the example of FIG. 3D, a mask 122 is formed over the nitride layer 106b using suitable photolithographic techniques, where the mask 122 exposes portions of the layer 106b under which the bitlines (e.g., prospective source and drain regions 105 and 107) are to be formed. An implantation process 120 is then performed to implant suitable dopants through the exposed portions of the layers 106 and into the underlying substrate 102 to form the source 105 and the drain 107, leaving a channel region of the p-type substrate 102 therebetween. In the exemplary device 100, the substrate 102 is lightly p-doped silicon, where the bitline implantation at 222 (e.g., process 120) provides one or more n-type dopants (e.g., arsenic, phosphorous, antimony, etc.) at a concentration of about 7.5 E14 to 2.0 E15 $cm^{-3}$, at an energy level of about 40–70 KeV, to form the bitline regions (e.g., source/drains 105, 107). Other dopant types (e.g., n or p-type), compositions, and/or concentrations can alternatively be used to form the source 105 and the drain 107 (e.g., the bitlines of the exemplary virtual ground array 54) at 222 within the scope of the invention, after which the mask 122 is removed. In one possible alternative, the bitline implantation at 222 can be performed prior to formation of one or both of the material layers 106.

At 224 and 226, a polysilicon wordline or control gate structure 110 is formed and selectively implanted to provide conductive wordlines in the array 54. A layer of polysilicon material 110 is deposited or otherwise formed at 224 over the charge trapping material 106b (e.g., layer 110 is deposited in FIG. 3F). Any suitable deposition processes may be employed and the polysilicon 110 may be formed to any suitable thickness at 224 within the scope of the invention. Furthermore, any suitable material may be employed in forming a control gate within the scope of the invention, including but not limited to doped polysilicon, metals, metal silicides, etc.

At 226, the exemplary polysilicon material layer 110 is selectively patterned to define polysilicon wordlines that operate as control gates for the cells 101, where the control gate 110 is formed over the charge trapping material 106b above the channel region of the substrate 102. Any suitable patterning techniques may be employed to define the polysilicon control gate/wordline structure 110 at 226 within the scope of the invention, such as masking and reactive ion etching (e.g., RIE etch processes 130 and mask 132 in FIG. 3F) to remove select portions of the polysilicon 110, wherein the etch process 130 may, but need not, remove some or all of the charge trapping and dielectric material layers 106 between adjacent patterned wordline/control gate structures 110. Further, the formation and patterning of the polysilicon control gates 110 at 226 may be concurrently used to form or define polysilicon transistor gate structures in transistors outside the memory array area of the device 100 (not shown).

In the exemplary device 100, the patterned polysilicon wordline/control gate structures 110 extend generally perpendicular to the bitline direction along rows of the prospective flash memory array 54. However, other relative orientations are possible and are contemplated as falling within the scope of the invention. The control gate structures 110, if formed using polysilicon, can also be implanted at 226 to render the polysilicon more conductive, which may be done before or after patterning, wherein the wordline implantation may concurrently operate as a source/drain or drain extension (e.g., LDD) implant for logic transistors in the device periphery (not shown). The method 200 ends at 228 following the completion of the flash cell fabrication, after which back-end processing (e.g., sidewall spacer formation, silicide processing, metalization, packaging, etc.) may be performed to complete the device 100, including the exemplary cell 101.

Figure 4:
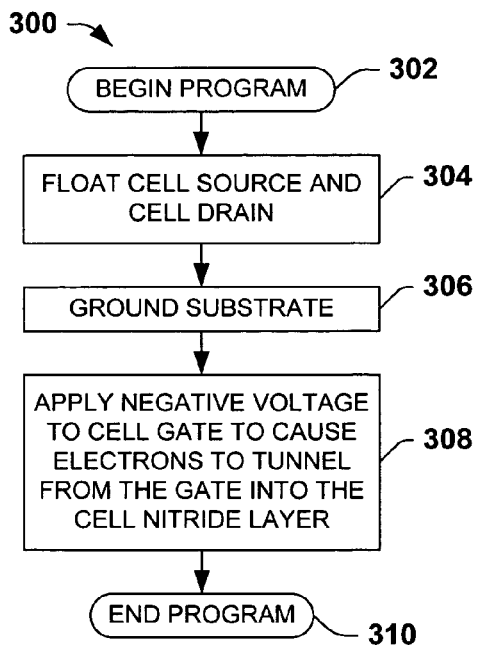
FIG. 4 is a flow diagram illustrating a method of programming a flash memory cell in accordance with another aspect of the invention.
Figure 5:
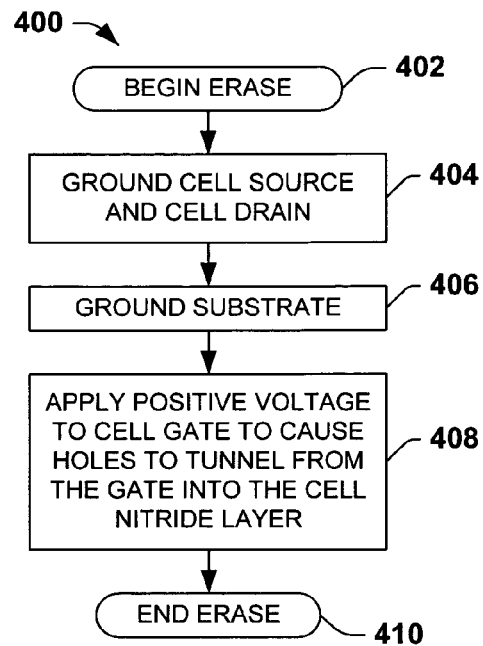
FIG. 5 is a flow diagram illustrating a method of erasing a flash memory cell in accordance with another aspect of the invention.

Referring now to FIGS. 4 and 5, another aspect of the invention relates to methods for setting flash memory cell data states including single-bit cell programming and erasing, as well as setting a flash cell to one of a plurality of data states, which may be used in conjunction with the exemplary cell 101 and the device 100 illustrated and described above, or with other flash memory cells and devices (e.g., including multi-bit or multi-level devices), within the scope of the invention. The methods comprise transferring charge between the cell control gate and the charge trapping material to set a threshold voltage of the cell to one of a plurality of value ranges. For example, to program a single-bit cell, or to raise the threshold voltage of a multi-bit cell, the method comprises directing electrons from the control gate into the charge trapping material. To erase a single-bit cell, or to lower the cell threshold voltage, the invention provides for directing electrons from the charge trapping material into the control gate. The exemplary cell 101 and other cells and cell gate structures of the present invention are ideally suited to programming and erase operations in which tunneling charge migrates between the control gate 110 and the underlying charge trapping material 106b, wherein the exemplary program and erase methods of the invention advantageously avoid or mitigate interface damage associated with conventional flash memory operational techniques in which charge was transferred through the substrate/dielectric interface. Accordingly, the above structures and the following methods of the invention may advantageously operate to improve flash memory device reliability, endurance, life expectancy, etc.

Programming operations and data state setting operations where a threshold voltage is to be raised according to this aspect of the invention generally involve coupling the semiconductor body (e.g., substrate 102 or portions or regions thereof in FIG. 1A) to a substrate voltage potential, and coupling the cell control gate (e.g., gate 110) to a gate voltage potential, where the gate voltage potential is lower than the substrate voltage potential. This approach is very different from conventional SONOS and floating gate programming techniques, in which a relatively large positive gate programming voltage was used. The application of the gate and substrate programming voltage potentials of the invention causes the threshold voltage of the flash memory cell to be set or maintained above an erased cell threshold voltage in a single-bit cell 101, and generally raises the cell threshold voltage for multi-level cell implementations. As discussed above, the threshold voltage of a programmed single-bit flash memory cell 101 is higher than the threshold voltage of an erased cell, wherein a programming includes any operation (e.g., method 300), acts, or events, which cause or ensure that sufficient charge is stored in the cell (e.g., in the charge trapping material 106b of cell 101) such that the threshold voltage is above an erased cell threshold voltage for the single bit cell 101.

FIG. 4 illustrates an exemplary single-bit flash memory programming method 300 in accordance with this aspect of the invention, which may be carried out in the exemplary flash cell 101 above. The method 300 also exemplifies one aspect of setting a flash memory cell to one of a plurality of data states, by transferring charge between the control gate and the charge trapping material. Beginning at 302 in FIG. 4, the cell source and cell drain (e.g., source 105 and drain 107 in FIG. 1A) are optionally floated at 304, and the substrate (e.g., semiconductor body 102) is grounded at 306. At 308, the control gate 110 is coupled to a negative voltage potential to cause electrons to tunnel from the control gate 110 into the cell charge trapping medium (e.g., nitride layer 106b), before the programming method 300 ends at 310.

Other relative gate and substrate voltage levels may be employed in which the gate 110 is at a lower potential than the substrate 102 during programming, wherein all such alternative implementations are contemplated as falling within the scope of the invention. The single-bit cell 101 is thus set to the programmed state (e.g., the cell threshold voltage is higher than an erased cell threshold voltage value) following the program operation regardless of the initial state. In this regard, if a previously erased cell 101 is programmed, electrons are provided to the charge trapping material 106b. Where a previously programmed cell 101 is again programmed, more electrons may be added into the material 106b, or in any event a sufficient amount of trapped electrons remain in the material 106b, such that the threshold voltage of the cell 101 is above the erased cell threshold voltage value.

FIG. 5 illustrates an exemplary flash memory erase method 400 according to the present invention. In general, single-bit and multi-level erase operations of the invention involve coupling the semiconductor body 102 to a substrate voltage potential, and coupling the cell control gate 110 to a gate voltage potential, where the gate voltage potential is higher than the substrate voltage potential. This is also different from prior SONOS and floating gate erase methods, wherein a relatively large negative gate voltage was used. In the single-bit erase techniques of the present invention, the applied gate and substrate voltages ensure that the cell threshold voltage is below a programmed cell threshold voltage following the erase operation, regardless of the initial cell data state. The method 400 also exemplifies another general aspect of setting a flash memory cell to one of a plurality of data states, by transferring charge between the charge trapping material and the control gate, which finds application in single or multi-bit implementations.

The exemplary method 400 begins at 402, where the source and drain (e.g., source 105 and drain 107) are optionally grounded at 404, and the substrate 102 (or portions thereof) is grounded at 406. At 408, the control gate is coupled to a positive voltage, causing holes to tunnel from the control gate 110 into the charge trapping material 106b of the cell 101 (e.g., formerly trapped electrons tunnel from the charge trapping nitride 106b upward to the control gate 110, or holes tunnel from the gate 110 into the charge trapping material 106b). Other relative gate and substrate voltage potentials may be used to lower the cell threshold voltage within the scope of the invention, wherein the gate 110 is at a higher potential than the substrate 102 during an erase or data state setting operation, for example, wherein the source 105 and drain 107 may be coupled with the substrate voltage.

A single-bit erase operation of the present invention is any operation that causes or ensures that the cell threshold voltage is below a programmed cell threshold voltage following the erase operation. Thus, where a previously programmed cell is erased, electrons are removed from the charge trapping material 106b (e.g., holes are provided to the material 106b) such that the threshold voltage of the cell 101 is below the programmed cell threshold voltage value. Where a previously erased cell is again erased, more electrons may be removed from (e.g., more holes added to) the material 106b, or in any event less than a certain amount of trapped electrons remain therein, such that the threshold voltage of the cell 101 is below the programmed cell threshold voltage value.

Referring now to FIGS. 6 and 7, the flash memory cells and methods of the invention may be employed in devices of any array configuration, in which FIG. 6 illustrates an alternative NOR array configuration 54a in a device 100a, and FIG. 7 illustrates an exemplary alternative NAND type array 54b in a device 100b, wherein the devices 100a and 100b may be comprised of cells 101 and are otherwise as described above. In the NOR configuration of FIG. 6, each cell drain terminal (e.g., drain 107 in FIG. 1A) within a particular array column is coupled to the same bitline, and the cell control gates 110 are coupled with a wordline of the corresponding array row, while the cell sources 105 are coupled to a common source terminal (CS). In operation, individual flash cells 101 may be individually addressed via the respective bitline and wordline using peripheral decoder and control circuitry for programming, reading or erasing functions, as described above.

In the NAND configuration of FIG. 7, the individual cells 101 along a given array column are coupled in series, with the drain of one cell 101 being coupled with the source of the next cell 101, and with the cell control gates 110 being coupled with a wordline of the corresponding array row. The drains 107 of the uppermost cells 101 of the array columns are selectively coupled with a corresponding bitline via a corresponding drain select transistor and the sources 105 of the bottom cells 101 are selectively coupled with ground or other control voltage potentials (not shown) via source select transistors. The control voltages applied to the wordlines, the bitlines, and the lowermost cell sources, as well as to the device semiconductor body are such that the conditions described above are provided for programming and erase operations. In general, the access of a particular row in the NAND array 54b for reading is accomplished by pulling the control gates (e.g., wordlines) of all non-selected rows high, whereby the selected cell source 105 is coupled to a voltage potential (e.g., ground) through the corresponding source select transistor and any cells 101 below it, and the selected cell drain 107 is coupled to the corresponding bitline through the corresponding drain select transistor and any cells 101 above it. Other array configurations are possible within the scope of the invention, including but not limited to NAND, NOR, AND, virtual ground, DINOR, etc.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A flash memory cell, comprising:
a source formed in a substrate;
a drain formed in the substrate, the source and the drain being spaced from one another on laterally opposite sides of a channel region of the substrate;
a dielectric material formed above the channel region of the substrate;
a charge trapping material formed over the dielectric material; and
a control gate formed over the charge trapping material, wherein the control gate is located directly on the charge trapping material and the electrons are directed from the control gate directly into the charge trapping material without traveling through an intermediary layer.

2. The flash memory cell of claim 1, wherein the dielectric material comprises an oxide.

3. The flash memory cell of claim 1, wherein the charge trapping material comprises silicon nitride.

4. The flash memory device of claim 1, wherein the control gate comprises polysilicon.

5. A gate structure for a flash memory cell, the gate structure comprising:
a dielectric material formed above a channel region of a substrate;
a charge trapping material formed over the dielectric material; and
a control gate formed over the charge trapping material, wherein the control gate is located directly on the charge trapping material and the electrons are directed from the control gate directly into the charge trapping material without traveling through an intermediary layer.

6. The gate structure of claim 5, wherein the dielectric material comprises an oxide.

7. The gate structure of claim 5, wherein the charge trapping material comprises silicon nitride.

8. The gate structure of claim 5, wherein the control gate comprises polysilicon.

9. A memory device comprising:
 a core region of the device comprising a plurality of flash memory cells respectively comprising:
  a source formed in a substrate;
  a drain formed in the substrate, the source and the drain being spaced from one another on laterally opposite sides of a channel region of the substrate;
  a dielectric material formed above the channel region of the substrate;
  a charge trapping material formed over the dielectric material; and
  a control gate formed over the charge trapping material, wherein the control gate is located directly on the charge trapping material and the electrons are directed from the control gate directly into the charge trapping material without traveling through an intermediary layer; and
 a peripheral region of the device comprising I/O circuitry and programming circuitry.

10. The device of claim 9, wherein the programming circuitry is formed in the substrate and comprises x-direction decoders and y-direction decoders.

11. The device of claim 10, wherein the programming circuitry and the I/O circuitry operate to couple selected cells of the flash memory cells with selected voltages and/or impedances during program, erase, and read operations.

12. The device of claim 9, wherein the flash memory cells are arranged in a virtual ground configuration.

13. The device of claim 9, wherein the flash memory cells are arranged in a NOR configuration.

14. The device of claim 9, wherein the charge trapping material comprises silicon nitride.

15. The device of claim 9, wherein the control gate comprises polysilicon.

16. The device of claim 9, wherein rows of the flash memory cells have control gates coupled to corresponding wordlines and columns of the flash memory cells have drains coupled to corresponding bitlines and sources of adjacent flash memory cells.

* * * * *